(12) United States Patent
Kim et al.

(10) Patent No.: US 11,271,061 B2
(45) Date of Patent: Mar. 8, 2022

(54) CAPACITOR STRUCTURE FOR ORGANIC LIGHT-EMITTING DISPLAY APPARATUS AND MANUFACTURING METHOD THEREOF

(71) Applicant: Samsung Display Co., Ltd., Yongin-si (KR)

(72) Inventors: Seulki Kim, Yongin-si (KR); Seungsok Son, Yongin-si (KR); Jungkyoung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 24 days.

(21) Appl. No.: 16/538,255

(22) Filed: Aug. 12, 2019

(65) Prior Publication Data

US 2020/0052057 A1 Feb. 13, 2020

(30) Foreign Application Priority Data

Aug. 13, 2018 (KR) ........................ 10-2018-0094621

(51) Int. Cl.
*H01L 27/32* (2006.01)
*H01L 27/12* (2006.01)
*H01L 29/786* (2006.01)

(52) U.S. Cl.
CPC ...... *H01L 27/3265* (2013.01); *H01L 27/3262* (2013.01); *H01L 27/3272* (2013.01);
(Continued)

(58) Field of Classification Search
CPC ............. H01L 27/3265; H01L 27/3276; H01L 27/3272; H01L 27/3262; H01L 27/124;
(Continued)

(56) References Cited

U.S. PATENT DOCUMENTS

2015/0097172 A1* 4/2015 Han .................... H01L 27/3265
257/40
2015/0179724 A1* 6/2015 Lee ..................... H01L 27/3241
257/40

(Continued)

FOREIGN PATENT DOCUMENTS

JP 2017-173505 9/2017
KR 10-2015-0041511 4/2015
(Continued)

*Primary Examiner* — Thao X Le
*Assistant Examiner* — Gardner W. S. Swan
(74) *Attorney, Agent, or Firm* — H.C. Park & Associates, PLC

(57) ABSTRACT

An organic light-emitting display apparatus includes: a display unit including an organic light-emitting element, a driving transistor electrically connected to the organic light-emitting element, and a capacitor; and a pad unit connected to the display unit, the capacitor including: a first conductive layer disposed on a substrate; a second conductive layer interposed between the substrate facing a first surface of the first conductive layer; and a third conductive layer disposed facing a second surface of the first conductive layer opposing the first surface of the first conductive layer, the third conductive layer being electrically connected to the second conductive layer.

20 Claims, 6 Drawing Sheets

(52) U.S. Cl.
CPC ........ *H01L 27/3276* (2013.01); *H01L 27/124* (2013.01); *H01L 27/1225* (2013.01); *H01L 27/1255* (2013.01); *H01L 27/1259* (2013.01); *H01L 29/7869* (2013.01); *H01L 29/78633* (2013.01); *H01L 2227/323* (2013.01)

(58) Field of Classification Search
CPC ............. H01L 27/1259; H01L 27/1255; H01L 27/1225; H01L 29/7869; H01L 29/78633; H01L 29/41733; H01L 2227/323
USPC .......................................................... 257/40
See application file for complete search history.

(56) References Cited

U.S. PATENT DOCUMENTS

| | | | |
|---|---|---|---|
| 2016/0351122 | A1 | 12/2016 | Jung et al. |
| 2017/0192585 | A1* | 7/2017 | Ma ........................ G06F 3/0446 |
| 2017/0278916 | A1 | 9/2017 | Maruyama |
| 2017/0294498 | A1 | 10/2017 | Kwon |
| 2018/0090551 | A1 | 3/2018 | Sato |
| 2018/0175077 | A1* | 6/2018 | Koo ....................... H01L 27/127 |
| 2018/0182836 | A1* | 6/2018 | Beak ................... H01L 27/3265 |
| 2019/0131369 | A1* | 5/2019 | Choi ................... H01L 27/3276 |
| 2020/0052055 | A1* | 2/2020 | Song ................... H01L 51/0096 |

FOREIGN PATENT DOCUMENTS

| | | |
|---|---|---|
| KR | 10-2016-0141366 | 12/2016 |
| KR | 10-2017-0115640 | 10/2017 |

* cited by examiner

CAPACITOR STRUCTURE FOR ORGANIC LIGHT-EMITTING DISPLAY APPARATUS AND MANUFACTURING METHOD THEREOF

CROSS-REFERENCE TO RELATED APPLICATION

This application claims priority from and the benefit of Korean Patent Application No. 10-2018-0094621, filed on Aug. 13, 2018, which is hereby incorporated by reference for all purposes as if fully set forth herein.

BACKGROUND

Field

Exemplary embodiments/implementations of the invention relate generally to an organic light-emitting display apparatus and a method of manufacturing the same, and more specifically, to an organic light-emitting display apparatus having an improved structure and a method of manufacturing the organic light-emitting display apparatus.

Discussion of the Background

An organic light-emitting display apparatus typically includes, in each pixel, a thin film transistor, a capacitor, and an organic light-emitting element connected to the thin film transistor and the capacitor, and a desired image is realized as the organic light-emitting element emits light by receiving an appropriate driving signal from the thin film transistor.

Here, a sufficient charge capacity of the capacitor may be required to stably realize images by using the organic light-emitting display apparatus. That is, the capacitor having sufficient charge capacity may maintain a stable voltage of the thin film transistor without fluctuations during light emission of the organic light-emitting element to produce natural images.

Accordingly, a capacitor having a relatively large charge capacity generally requires increased size in planar area. However, recent increases in resolution of organic light-emitting display apparatuses has gradually decreased a planar space allocated to each pixel, and therefore, the planar area for the capacitor is also limited.

The above information disclosed in this Background section is only for understanding of the background of the inventive concepts, and, therefore, it may contain information that does not constitute prior art.

SUMMARY

Devices constructed and methods according to exemplary implementations of the invention are capable of providing an organic light-emitting display apparatus with a capacitor having increased charge capacity without increasing a planar area taken up by the capacitor, and a method of manufacturing the organic light-emitting display apparatus.

Additional features of the inventive concepts will be set forth in the description which follows, and in part will be apparent from the description, or may be learned by practice of the inventive concepts.

According to one or more embodiments of the invention, an organic light-emitting display apparatus includes: a display unit including an organic light-emitting element, a driving transistor electrically connected to the organic light-emitting element, and a capacitor; and a pad unit connected to the display unit, the capacitor including: a first conductive layer disposed on a substrate; a second conductive layer interposed between the substrate facing a first surface of the first conductive layer; and a third conductive layer disposed facing a second surface of the first conductive layer opposing the first surface of the first conductive layer, the third conductive layer being electrically connected to the second conductive layer.

The driving transistor may include an active layer disposed on the substrate, a gate electrode disposed on the active layer, and a source electrode and a drain electrode disposed on the gate electrode, the source electrode and the drain electrode being connected to the active layer.

The second conductive layer may interposed between below the active layer of the driving transistor and the substrate.

The first conductive layer may be disposed on a same layer as the gate electrode.

The third conductive layer may be disposed on a same layer as the source electrode and the drain electrode.

The second conductive layer may include a light-shielding layer to block light from entering or exiting the substrate.

The second conductive layer may completely cover a planar area of the first conductive layer.

The organic light-emitting display apparatus may further include a fourth conductive layer disposed facing the third conductive layer on the opposite side of the first conductive layer.

The pad unit may include a metal layer disposed on a same layer as the source electrode and the drain electrode and an indium-tin-oxide (ITO) layer on the metal layer, the fourth conductive layer may be disposed on a same layer, and the fourth conductive layer may include the same material as the ITO layer.

The fourth conductive layer may be electrically connected to the first conductive layer.

According to one or more embodiments of the invention, a method of manufacturing an organic light-emitting display apparatus, includes: forming a display unit including an organic light-emitting element, a driving transistor, and a capacitor on a substrate; and forming a pad unit connected to the display unit, wherein the forming of the capacitor includes: forming a first conductive layer on the substrate; forming a second conductive layer interposed between the substrate facing a first surface of the first conductive layer, the second conductive layer facing a first surface of the first conductive layer; and forming a third conductive layer facing a second surface of the first conductive layer opposing the first surface, the third conductive layer being electrically connected to the second conductive layer.

The forming of the driving transistor may include: forming an active layer on the substrate; forming a gate electrode on the active layer; and forming a source electrode and a drain electrode on the gate electrode, the source electrode and the drain electrode being connected to the active layer.

The second conductive layer may interposed between the active layer of the driving transistor and the substrate.

The first conductive layer may be formed on a same layer as the gate electrode.

The third conductive layer may be formed on a same layer as the source electrode and the drain electrode.

The second conductive layer may include a light-shielding layer to block light from entering or exiting the substrate.

The second conductive layer may completely cover a planar area of the first conductive layer.

The method may further include forming a fourth conductive layer facing the third conductive layer on the opposite side of the first conductive layer.

The forming of the pad unit may include forming a metal layer on a same layer as the source electrode and the drain electrode; and forming an indium-tin-oxide (ITO) layer on the metal layer, wherein the fourth conductive layer is disposed on a same layer as the ITO layer and formed of the same material as the ITO layer.

The fourth conductive layer may be electrically connected to the first conductive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
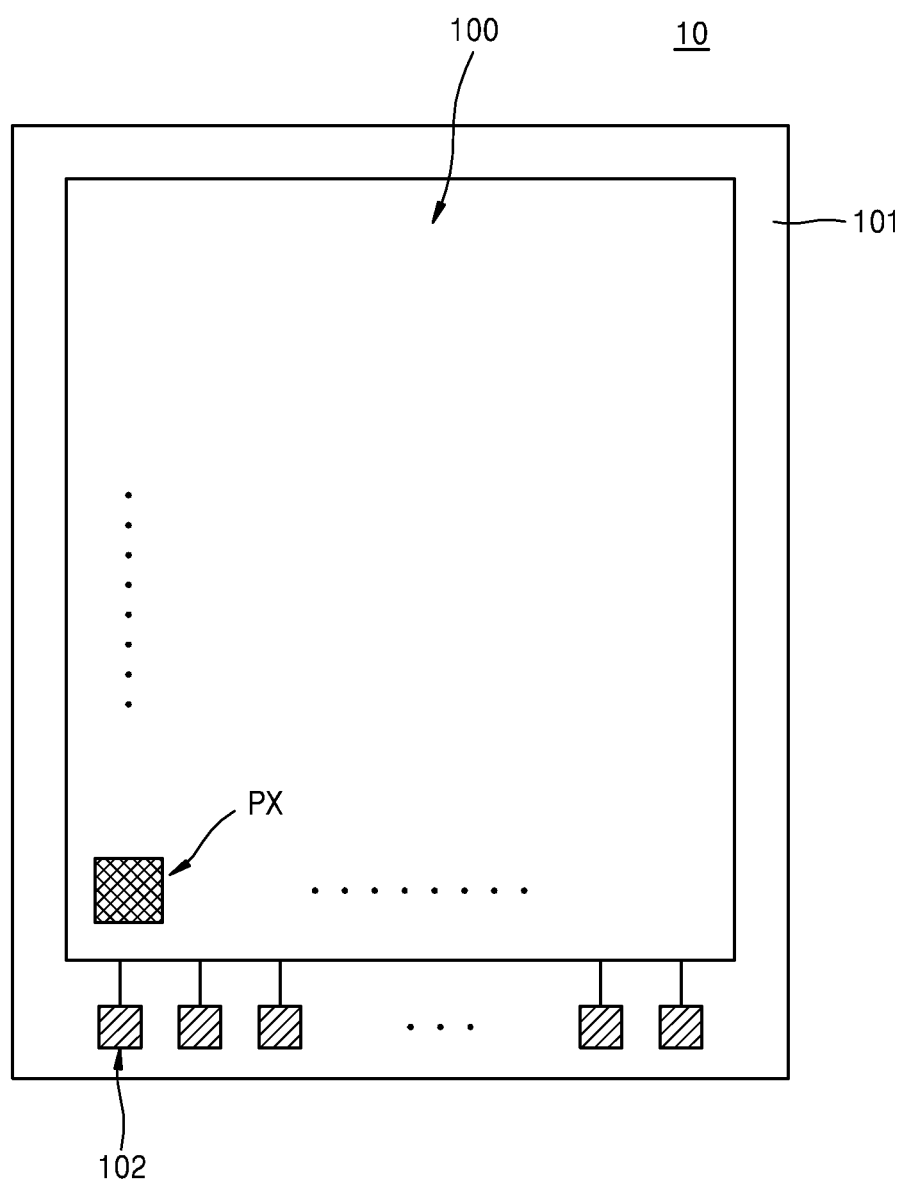
FIG. 1 is a plan view of an organic light-emitting display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of an organic light-emitting display apparatus 10 according to an exemplary embodiment. As illustrated in FIG. 1, an organic light-emitting display apparatus 10 according to the current exemplary embodiment includes, a substrate 101, and a display unit 100 and a pad unit 102 disposed on the substrate 101. The display unit 100 is configured to realize an image, and the pad unit 102 is connected to the display unit 100 to which a flexible circuit board is connected.

Figure 2:
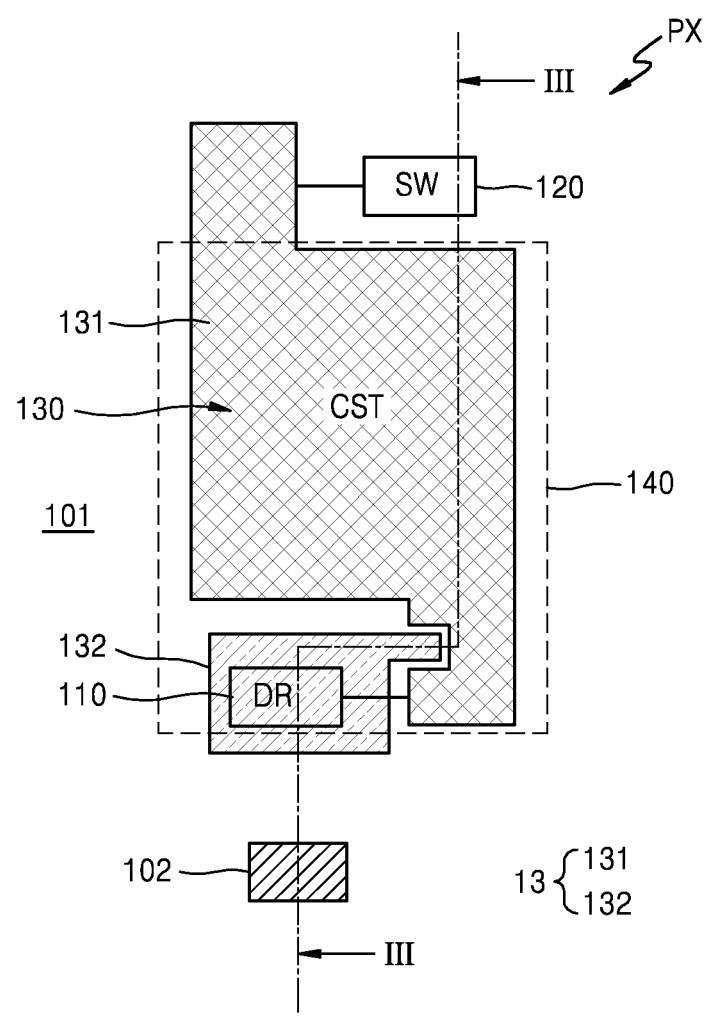
FIG. 2 is an enlarged plan view of a pixel illustrated in FIG. 1.

A plurality of pixels PX are arranged on the display unit 100, and each pixel PX approximately has a planar structure as illustrated in an enlarged view in FIG. 2.

FIG. 2 is an enlarged plan view of a pixel PX illustrated in FIG. 1. Referring to FIG. 2, a first base metal layer 131 and a second base metal layer 132 are disposed on the substrate 101. The first base metal layer 131 is arranged in an area of a capacitor 130, and the second base metal layer 132 is arranged in an area of a driving transistor 110, and both the first and second base metal layers 131 and 132 perform a light-shielding function to block light from entering or exiting through the substrate 101. The first base metal layer 131 and the second base metal layer 132 also provide electrical characteristics in connection with a first conductive layer 133 and a third conductive layer 134 which will be described later. Hereinafter, the first base metal layer 131 and the second base metal layer 132 are collectively referred to as second conductive layers 13.

A driving transistor 110 and a switching transistor 120 are formed on the second conductive layers 13, respectively. An organic light-emitting element 140 is formed on the driving transistor 110 and the capacitor 130, and the organic light-emitting element 140 is configured to generate light emission. Particularly, the region enclosed by the dotted line represents an area of the light-emitting element 140.

Figure 3:
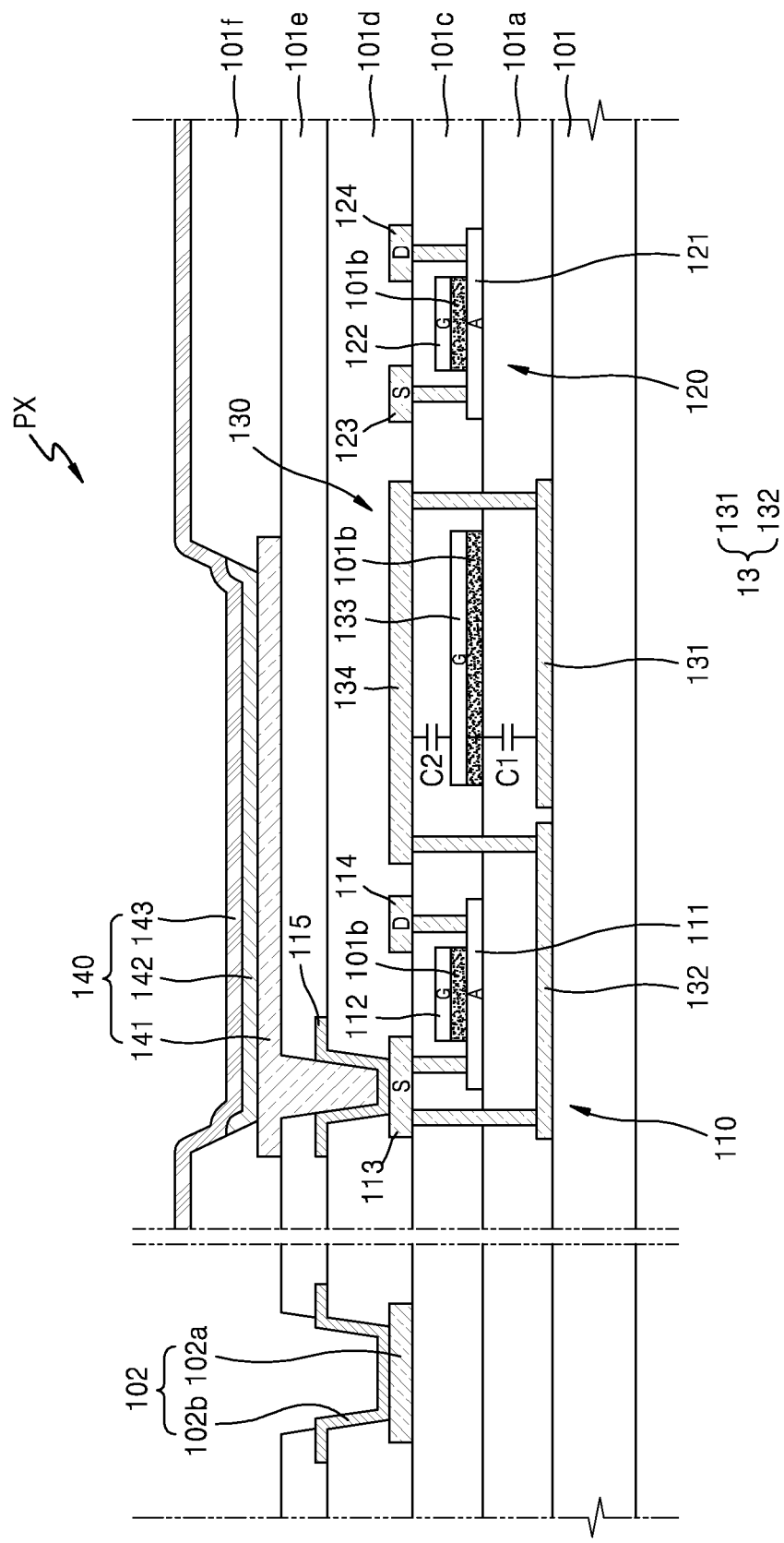
FIG. 3 is a cross-sectional view of the pixel of FIG. 2 taken along a sectional line III-III.

A cross-sectional structure of the pixel PX will now be described with reference to FIG. 3. FIG. 3 is a cross-sectional view of the pixel PX of FIG. 2 taken along a sectional line III-III.

As illustrated in FIG. 3, the driving transistor 110, the switching transistor 120, and the capacitor 130 are provided on the substrate 101, and the organic light-emitting element 140 connected to the driving transistor 110 is provided thereon.

First, the driving transistor 110 and the switching transistor 120 will be described, in which active layers 111 and 121 are formed on a buffer layer 101a, and gate electrodes 112 and 122 face the first and second active layers 111 and 121 with a gate insulating layer 101b interposed therebetween, and source electrodes 113 and 123 and drain electrodes 114 and 124 formed on the gate electrodes 112 and 122 with an interlayer insulating layer 101c interposed therebetween are connected to two ends of the active layers 111 and 121 doped with an N-type or P-type impurity. Hereinafter, the source electrodes 113 and 123 and the drain electrodes 114 and 124 will be referred together as source/drain electrodes 113, 114, 123, and 124. The active layers 111 and 121 may be formed of an oxide semiconductor and may include, for example, an oxide of a material selected from Group 12, 13, or 14 metal elements such as zinc (Zn), indium (In), gallium (Ga), tin (Sn), cadmium (Cd), germanium (Ge), and a combination thereof. For example, the active layers 111 and 121 formed of an oxide semiconductor may include G-I-Z-O[$(In_2O_3)a(Ga_2O_3)b(ZnO)_c$] (a, b, and c are respectively real numbers satisfying the condition of a≥0, b≥0, and c>0).

The driving transistor 110 and the switching transistor 120 have a nearly identical stack structure, except that the driving transistor 110, which is relatively close to the organic light-emitting element 140, further includes the second base metal layer 132 from among the second conductive layers 13 in a lower portion of the driving transistor 110. The second base metal layer 132 has a light-shielding function to block light from entering or exiting from the substrate 101 as described above to thereby prevent or reduce intermixing of external light with the light generated by the organic light-emitting element 140. The second base metal layer 132 is also connected to the source electrode 113 to thereby stabilize saturation characteristics of the source/drain electrodes 113 and 114 at the same time.

The organic light-emitting element 140 includes the pixel electrode 141 connected to the source electrode 113 and the drain electrode 114 of the driving transistor 110 with an indium tin oxide (ITO) layer 115 interposed therebetween, an opposite electrode 143 facing the pixel electrode 141, and an emissive layer 142 between the pixel electrode 141 and the opposite electrode 143. Accordingly, when appropriate voltage conditions are created between the opposite electrode 143 and the pixel electrode 141 as a voltage is applied to the pixel electrode 141 from the driving transistor 110, light emission takes place in the emissive layer 142. The emissive layer 142 may include all of a hole injection transport layer, an organic emissive layer, an electron injection transport layer or the like or selectively some of these layers.

Although not illustrated in the drawings, a protective layer may be further formed on the opposite electrode 143.

Reference numerals 101d, 101e, and 101f denote insulating layers, which are respectively a passivation layer, a via layer, and a pixel defining layer.

The pad unit 102 in an outer portion of the display unit 100 includes a metal layer 102a formed on a same layer and of the same material as the source/drain electrodes 113, 114, 123, and 124 and an ITO layer 102b on the metal layer 102a, and a flexible circuit board is connected to the ITO layer 102b that is exposed to the outside.

Next, a structure of the capacitor 130 according to the current exemplary embodiment will be described.

The capacitor 130 includes a first conductive layer 133, second conductive layers 13, and a third conductive layer 134 that face each other with insulating layers interposed therebetween.

The first conductive layer 133 is formed on a same layer as the gate electrodes 112 and 122. Also, the first conductive layer 133 is formed of the same material as the gate electrodes 112 and 122.

The second conductive layers 13 face the first conductive layer 133 with the buffer layer 101a and the gate insulating layer 101b interposed therebetween. The first base metal layer 131 among the second conductive layers 13 corresponds to the area of the capacitor 130.

The third conductive layer 134 faces the first conductive layer 133 with the interlayer insulating layer 101c interposed therebetween and is formed on a same layer as the source/drain electrodes 113, 114, 123, and 124. Also, third conductive layer 134 is formed of the same material as the source and drain electrodes 113, 114, 123, and 124.

According to this structure, a first capacitor C1 is formed between the first conductive layer 133 and the first base metal layer 131 of the second conductive layers 13, and a second capacitor C2 is formed between the first conductive layer 133 and the third conductive layer 134. That is, two capacitors, the first and second capacitors C1 and C2, are formed in a same area on a plane.

Figure 4:
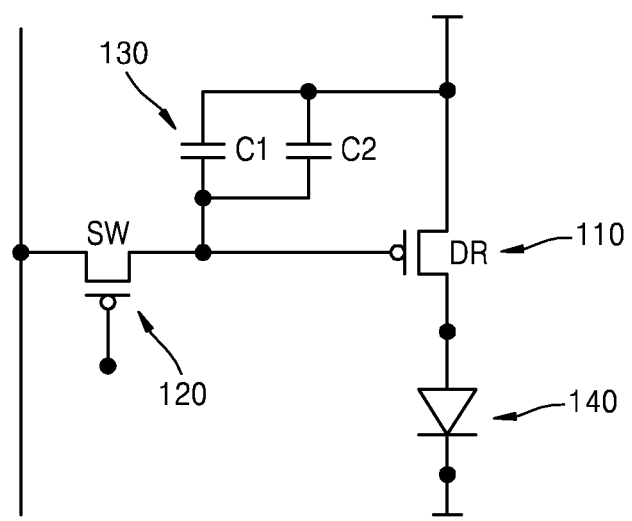
FIG. 4 is a circuit diagram of an organic light-emitting element, a transistor, and a capacitor illustrated in FIG. 3.

FIG. 4 is a circuit diagram of an organic light-emitting element 140, a transistor 110, and a capacitor 130 illustrated in FIG. 3. The structure of the capacitors described above is expressed as a circuit diagram as illustrated in FIG. 4 in which the two capacitors, the first and second capacitors C1 and C2, connected in parallel to each other provide a stable voltage to the driving transistor 110. That is, a capacity of the capacitor 130 may be increased by providing a double layer structure of the two capacitors, that is, the first and second capacitors C1 and C2 without increasing space occupancy thereof on a plane. Thus, according to this configuration, an organic light-emitting display apparatus in which a charge capacity is increased without increasing an area on a plane taken up by capacitors may be provided.

The organic light-emitting display apparatus having the above-described configuration may be manufactured as follows.

First, a first base metal layer 131 and a second base metal layer 132, which will be formed as second conductive layers 13, are formed on a substrate 101.

Then a buffer layer 101a is formed thereon, and then active layers 111 and 121 of a driving transistor 110 and a switching transistor 120 are formed on the buffer layer 101a. When viewed from the substrate 101, the active layer 111 of the driving transistor 110 is completely covered by the second base metal layer 132 provided in a lower portion of the driving transistor 110.

Next, a gate insulating layer 101b is formed on the active layers 111 and 121 and the buffer layer 101a, and gate electrodes 112 and 122 are formed on the gate insulating layer 101b, and a first conductive layer 133 is formed in an area of the capacitor 130 by using the same material as that of the gate electrodes 112 and 122. When viewed from the substrate 101, the first conductive layer 133 is completely covered by the first base metal layer 131.

Next, an interlayer insulating layer 101c is formed, and source/drain electrodes 113, 114, 123, and 124 of the driving transistor 110 and the switching transistor 120, a third conductive layer 134 of the capacitor 130, and a metal layer 102a of the pad unit 102 are formed on the interlayer insulating layer 101c by using the same material as each other. Here, a contact hole penetrates through the interlayer insulating layer 101c and the buffer layer 101a to connect the source/drain electrodes 113, 114, 123, and 124 and the active layers 111 and 121 to each other, the source electrode 113 and the second base metal layer 132 to each other, and the second conductive layers 13 and the third conductive layer 134 to each other.

Then a passivation layer 101d, ITO layers 115 and 102b, and a via layer 101e are formed, and then a pixel electrode 141, a pixel defining layer 101f, an emissive layer 142, and an opposite electrode 143 of the organic light-emitting element 140 are sequentially formed.

Accordingly, as illustrated in FIG. 3, the capacitor 130 having a high capacity may be realized within a relatively small planar area, and an organic light-emitting display apparatus including the capacitor 130 may have high light-shielding effects and a high resolution.

Figure 5:
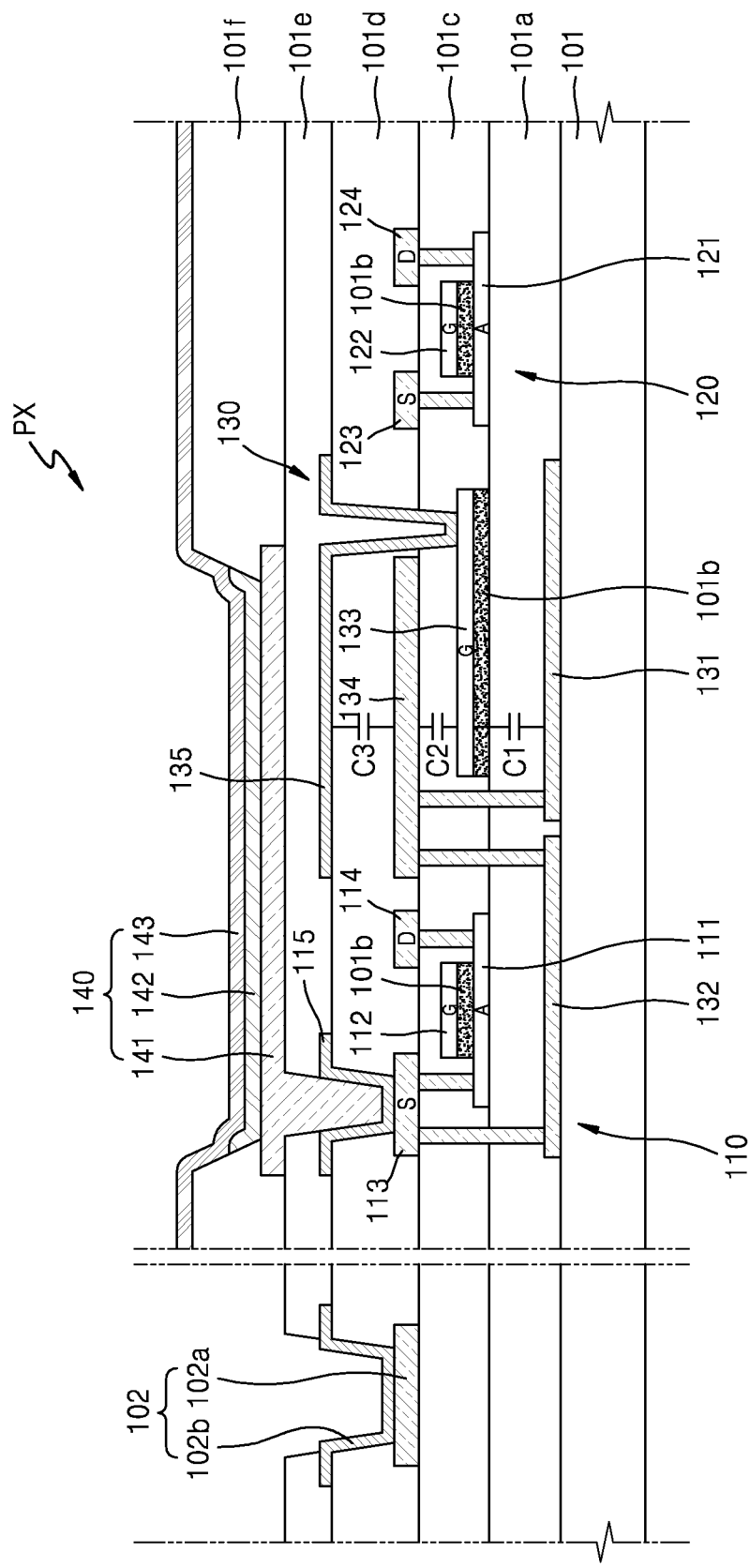
FIG. 5 is a cross-sectional view of an organic light-emitting display apparatus according to another exemplary embodiment.

Next, FIG. 5 is a cross-sectional view of an organic light-emitting display apparatus according to another exemplary embodiment.

The driving transistor 110, the switching transistor 120, the organic light-emitting element 140, and the pad unit 102 are identical to those described above with reference to FIG. 3, and therefore, the redundant descriptions are omitted.

Here, the capacitor 130 includes three capacitors C1, C2, and C3. That is, a fourth conductive layer 135 formed of the same material as the ITO layer 102b of the pad unit 102 is formed on the same layer as the ITO layer 102b facing the third conductive layer 134.

Accordingly, a first capacitor C1 is formed between the first conductive layer 133 and the first base metal layer 131 of the second conductive layers 13, a second capacitor C2 is formed between the first conductive layer 133 and the third conductive layer 134, and a third capacitor C3 is formed between the third conductive layer 134 and the fourth conductive layer 135. That is, three capacitors C1, C2, and C3 are formed in a same space on a plane.

Figure 6:
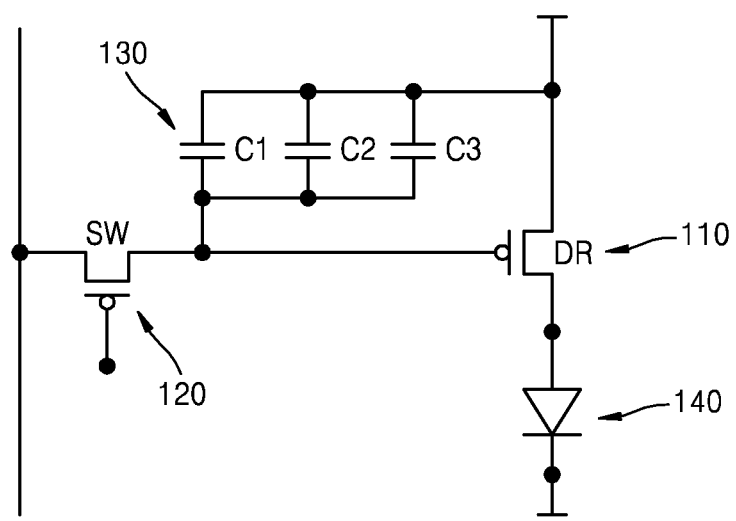
FIG. 6 is a circuit diagram of an organic light-emitting element, a transistor, and a capacitor illustrated in FIG. 5.

FIG. 6 is a circuit diagram of an organic light-emitting element 140, a transistor 110, and a capacitor 130 illustrated in FIG. 5. The structure of the capacitors described above is expressed as a circuit diagram as illustrated in FIG. 6 in which the three capacitors, the first through third capacitors C1, C2, and C3 connected in parallel to each other, provide a stable voltage to the driving transistor 110. That is, a capacity of the capacitor 130 may be increased by providing a multi-layer structure of the three capacitors, that is, the first through third capacitors C1, C2, and C3 without increasing space occupancy thereof on a plane. Thus, according to this configuration, an organic light-emitting display apparatus having a sufficient charge capacity obtained without increasing an area on a plane taken up by capacitors may be provided.

The manufacturing process of the above organic light-emitting display apparatus is also identical to the exemplary embodiment of FIG. 3, except that the fourth conductive layer 135 is additionally formed and connected to the first conductive layer 133 when forming the ITO layers 102b and 115 respectively on the metal layer 102a of the pad unit 102 and under the pixel electrode 141.

As described above, according to the organic light-emitting display apparatus of the current exemplary embodiment, a charge capacity of a capacitor may be sufficiently increased without increasing the planar area taken up by the capacitor, and thus, an organic light-emitting display apparatus may have high light-shielding effects and a high resolution.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting display apparatus comprising:
    a display unit including an organic light-emitting element, a driving transistor electrically connected to the organic light-emitting element, and a capacitor having a first terminal and a second terminal; and a pad unit connected to the display unit, the capacitor comprising:
        a first conductive layer disposed on a substrate, the first conductive layer corresponding to the first terminal of the capacitor;
        a second conductive layer having a first portion and a second portion, the first portion interposed between the first conductive layer and the substrate facing a first surface of the first conductive layer, the second portion interposed between the driving transistor and the substrate; and
        a third conductive layer disposed facing a second surface of the first conductive layer opposing the first surface of the first conductive layer, the third conductive layer being electrically connected to the first and second portions of the second conductive layer such that the third conductive layer and the first and second portions of the second conductive layer correspond to the second terminal of the capacitor,
        wherein the first portion and the second portion of the second conductive layer are spaced apart from each other on a same layer, and
        wherein the third conductive layer is directly connected to the first portion and the second portion of the second conductive layer through contact holes, respectively.

2. The organic light-emitting display apparatus of claim 1, wherein the driving transistor comprises an active layer disposed on the substrate, a gate electrode disposed on the active layer, and a source electrode and a drain electrode disposed on the gate electrode, the source electrode and the drain electrode being connected to the active layer.

3. The organic light-emitting display apparatus of claim 2, wherein the second portion of the second conductive layer is interposed between the active layer of the driving transistor and the substrate.

4. The organic light-emitting display apparatus of claim 2, wherein the first conductive layer and the gate electrode are disposed on a same layer.

5. The organic light-emitting display apparatus of claim 2, wherein the third conductive layer, the source electrode, and the drain electrode are disposed on a same layer.

6. The organic light-emitting display apparatus of claim 1, wherein the first portion and the second portion of the second conductive layer overlap the organic light-emitting element, and wherein at least one of the first and second portions of the second conductive layer comprises a light-shielding layer to block light.

7. The organic light-emitting display apparatus of claim 6, wherein the first portion of the second conductive layer completely covers a planar area of the first conductive layer.

8. The organic light-emitting display apparatus of claim 2, further comprising a fourth conductive layer disposed facing the third conductive layer on the second surface of the first conductive layer,
    wherein the first conductive layer, the first and the second portions of the second conductive layer, the third conductive layer, and the fourth conductive layer overlap the organic light-emitting element.

9. The organic light-emitting display apparatus of claim 8, wherein the pad unit comprises a metal layer disposed on a same layer as the source electrode and the drain electrode and an indium-tin-oxide (ITO) layer on the metal layer,
    wherein the fourth conductive layer and the ITO layer are disposed on a same layer, and the fourth conductive layer comprises a same material as the ITO layer.

10. The organic light-emitting display apparatus of claim 8, wherein the fourth conductive layer is electrically connected to the first conductive layer.

11. A method of manufacturing an organic light-emitting display apparatus, the method comprising:
    forming a display unit including an organic light-emitting element, a driving transistor, and a capacitor having a first terminal and a second terminal on a substrate; and
    forming a pad unit connected to the display unit,
    wherein the forming of the capacitor comprises:
        forming a first conductive layer on the substrate, the first conductive layer corresponding to the first terminal of the capacitor;
        forming a second conductive layer having a first portion and a second portion, the first portion interposed between the first conductive layer and the substrate facing a first surface of the first conductive layer, the second portion interposed between the driving transistor and the substrate; and
        forming a third conductive layer facing a second surface of the first conductive layer opposing the first surface, the third conductive layer being electrically connected to the first and second portions of the second conductive layer such that the third conductive layer and the first and second portions of the second conductive layer correspond to the second terminal of the capacitor,
        wherein the first portion and the second portion of the second conductive layer are spaced apart from each other on a same layer, and
        wherein the third conductive layer is directly connected to the first portion and the second portion of the second conductive layer through contact holes, respectively.

12. The method of claim 11, wherein the forming of the driving transistor comprises:
    forming an active layer on the substrate;
    forming a gate electrode on the active layer; and
    forming a source electrode and a drain electrode on the gate electrode, the source electrode and the drain electrode being connected to the active layer.

13. The method of claim 12, wherein the second portion of the second conductive layer is interposed between the active layer of the driving transistor and the substrate.

14. The method of claim 12, wherein the first conductive layer and the gate electrode are formed on a same layer.

15. The method of claim 12, wherein the third conductive layer, the source electrode, and the drain electrode are formed on a same layer.

16. The method of claim 11, wherein at least one of the first and second portions of the second conductive layer comprises a light-shielding layer to block light.

17. The method of claim 16, wherein the first portion of the second conductive layer completely covers a planar area of the first conductive layer.

18. The method of claim 12, further comprising forming a fourth conductive layer facing the third conductive layer on the second surface of the first conductive layer.

19. The method of claim 18, wherein the forming of the pad unit comprises:
   forming a metal layer on a same layer as the source electrode and the drain electrode; and
   forming an indium-tin-oxide (ITO) layer on the metal layer,
   wherein the fourth conductive layer and the ITO layer are disposed on a same layer, and the fourth conductive layer is formed of a same material as the ITO layer.

20. The method of claim 18, wherein the fourth conductive layer is electrically connected to the first conductive layer.

* * * * *